(12) United States Patent
Xia et al.

(10) Patent No.: US 8,942,037 B2
(45) Date of Patent: Jan. 27, 2015

(54) THRESHOLD ACQUISITION AND ADAPTION IN NAND FLASH MEMORY

(71) Applicant: LSI Corporation, Milpitas, CA (US)

(72) Inventors: Haitao Xia, San Jose, CA (US); Fan Zhang, Milpitas, CA (US); Ming Jin, Fremont, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 280 days.

(21) Appl. No.: 13/664,583

(22) Filed: Oct. 31, 2012

(65) Prior Publication Data

US 2014/0119113 A1 May 1, 2014

(51) Int. Cl.
G11C 11/34 (2006.01)
(52) U.S. Cl.
USPC ............. 365/185.03; 365/185.22; 365/185.24
(58) Field of Classification Search
CPC ................ G11C 11/5628; G11C 11/5642
USPC ............................ 365/185.03, 185.22, 185.24
See application file for complete search history.

(56) References Cited

U.S. PATENT DOCUMENTS

| | | | |
|---|---|---|---|
| 7,483,305 B2 | 1/2009 | Yamada | |
| 7,558,109 B2 | 7/2009 | Brandman et al. | |
| 7,782,666 B2 * | 8/2010 | Cho et al. | 365/185.03 |
| 7,821,839 B2 | 10/2010 | Alrod et al. | |
| 7,983,082 B2 * | 7/2011 | Park et al. | 365/185.09 |
| 8,125,827 B2 | 2/2012 | Park | |
| 2012/0008386 A1 | 1/2012 | Chilappagari et al. | |
| 2012/0269001 A1 * | 10/2012 | Ueno et al. | 365/185.22 |

* cited by examiner

*Primary Examiner* — Son Dinh

(74) *Attorney, Agent, or Firm* — Suiter Swantz pc llo (57) ABSTRACT

A method, apparatus, and controller for acquiring and tracking at least one threshold voltage of at least one cell of at least one flash chip. The method can include acquiring the at least one threshold voltage of a particular cell of the at least one flash cell. The method can further include performing at least one threshold voltage adjustment iteration.

20 Claims, 8 Drawing Sheets

THRESHOLD ACQUISITION AND ADAPTION IN NAND FLASH MEMORY

BACKGROUND OF THE INVENTION

In NAND flash memory, cells are organized by word-lines and bit-lines into blocks. A block can have about 100,000 cells. Cells can be programmed as single-level cells (SLCs, one-bit per cell) or multi-level cells (MLCs, at least two-bit per cell), such as triple-level cells (TLCs, three-bit per cell). An SLC has one level in order to store memory; whereas, an MLC has multiple cell levels in order to store more memory. As the number of levels in a cell increases, a finer threshold voltage is needed for programming and read-back; this finer threshold voltage makes MLCs prone to noise.

Given an SLC cell as example, the threshold voltage determines whether a read-back voltage from an NAND cell is a 0 or 1. For example, if the read-back voltage is less than the threshold voltage, the cell will be read as having a value of 1; if the read-back voltage is greater than the threshold voltage, the cell will be read as having a value of 0. Over time and temperature changes, the average read-back voltages associated with a cell can drift such that the actual threshold voltage will drift away from the initial threshold voltage. This drift of the threshold voltage level is referred to as the aging effect (and is also known as retention). The aging effect is caused by the leakage of electrons from the cell. Because the aging effect causes the actual threshold voltage to drift away from the initial threshold voltage, a value of a cell can be read incorrectly. For example, a read-back voltage can be less than the initial threshold voltage but above the actual threshold voltage such that the cell is incorrectly read as a 0 based upon the initial threshold voltage, when in fact the cell should be read as a 1 because the actual threshold voltage has drifted.

Therefore, it can be desirable to provide a method, system, and apparatus which address fine threshold voltages, the aging effect, and the above-referenced problems.

SUMMARY OF THE INVENTION

Accordingly, a method is included for acquiring and tracking at least one threshold voltage of at least one cell of at least one flash chip. The method can include acquiring the at least one threshold voltage of a particular cell of the at least one flash cell. The method can further include performing at least one threshold voltage adjustment iteration.

Additionally, an apparatus is included. The apparatus can comprise a controller configured for acquiring and tracking at least one threshold voltage of at least one cell of at least one flash chip. The controller can be further configured for acquiring the at least one threshold voltage of a particular cell of the at least one flash cell and performing at least one threshold voltage adjustment iteration.

Further, an embodiment can include a flash memory system. The flash memory system can comprise at least one flash chip and a controller. The controller can be configured for acquiring and tracking at least one threshold voltage of at least one cell of the at least one flash chip. The controller can be further configured for acquiring the at least one threshold voltage of a particular cell of the at least one flash cell and performing at least one threshold voltage adjustment iteration.

It is to be understood that both the foregoing general description and the following detailed description are exemplary and explanatory only and are not restrictive of the invention claimed. The accompanying drawings, which are incorporated in and constitute a part of the specification, illustrate embodiments of the invention and together with the general description, serve to explain the principles.

BRIEF DESCRIPTION OF THE DRAWINGS

The numerous objects and advantages of the present invention can be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications, and equivalents are encompassed. For the purpose of clarity, technical material that is known in the technical fields related to the embodiments has not been described in detail to avoid unnecessarily obscuring the description.

Embodiments of the invention can reduce user time necessary to reprogram threshold voltages, increase NAND flash life cycles, and improve controller performance (such as performance related to bit error rate and sector error rate).

The threshold voltage(s) of a flash cell are programmable. The threshold voltage(s) of a flash cell can be programmed by a user, hardware (such as an NAND flash controller, a threshold programming module of a flash controller, a processor, or the like), software, or the like. Accurately programming the threshold voltage is critical for accurately reading back a correct data value from a cell.

Figure 1A:
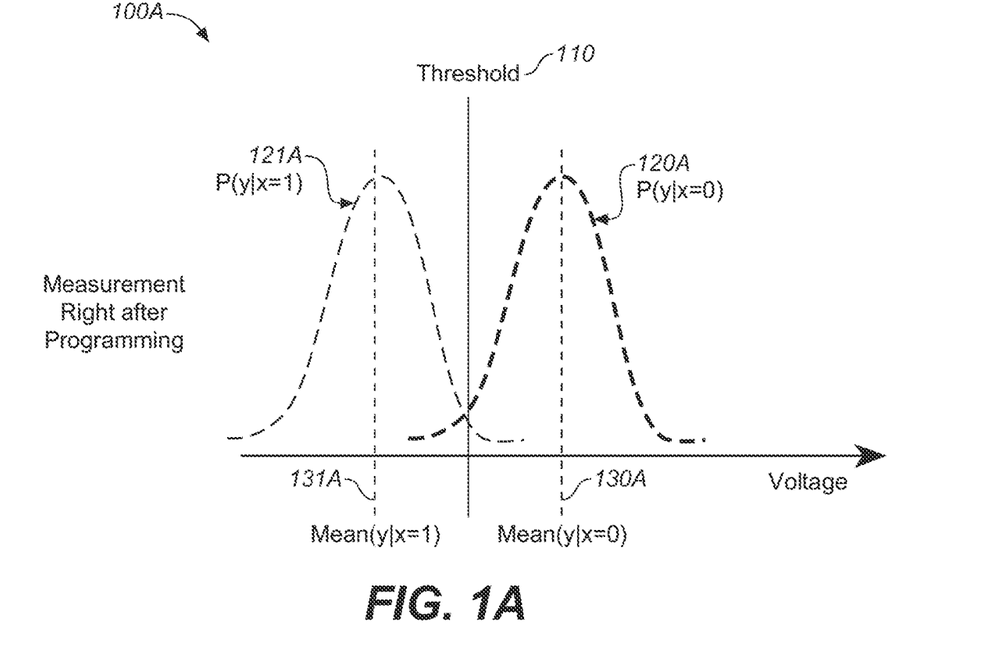
FIG. 1A shows a graphical diagram of a programmed threshold voltage value and two distributions of read-back voltages associated with values (i.e., 0 and 1) of a single-level cell (SLC) of a flash chip.

Programmed threshold voltages (such as the initially programmed threshold voltage 110) are used to make a hard decision to determine a bit value of an NAND flash cell. For example, for a single level cell (SLC), which can store a one-bit value (i.e., 0 or 1), a read-back voltage received from the SLC is compared to a programmed threshold voltage to make a hard decision as to whether to read the SLC as a 0 or 1.

The read-back voltages of a particular level of an NAND flash cell can be aggregated or compiled into a distribution such that statistical and/or probabilistic parameters can be computed (including mean, variance, standard deviation, median, mode, or the like). Furthermore, distributions of read-back voltages can be approximated by any suitable statistical or probabilistic distribution (such as the normal (Gaussian) distribution, t-distribution, F-distribution, exponential distribution, Chi-squared distribution, or the like). The probability distribution of read-back voltages of a particular level of an NAND flash cell can be used to generate soft information for soft-decision decoding, such as soft Reed-Solomon decoding, soft BCH (Bose, Chaudhuri, and Hocquenghem) decoding, low density parity check (LDPC) decoding, or the like.

Referring to FIG. 1A, a graphical diagram 100A of a programmed threshold voltage value 110 and two distributions 120A, 121A of read-back voltages associated with values (i.e., 0 and 1) of an SLC is shown.

The distribution 120A of read-back voltages associated with single level cell having the programmed value of 0 can be referred to as P(y|x=0). P(y|x=0) denotes the probability distribution of y given that x=0; in FIG. 1A, P(y|x=0) denotes the probability distribution of read-back voltages (i.e., y) given that the single level cell (SLC) was programmed with the value of 0 (i.e., x=0). The mean 130A of the probability distribution 120A (i.e., P(y|x=0)) is denoted as mean(y|x=0). The mean 130A (i.e., mean(y|x=0)) represents the average voltage for the distribution 120A of read-back voltages given that the SLC was programmed with the value of 0. The mean 130A (i.e., mean(y|x=0)) can be represented as $V_0$, such that:

$V_0$=mean(y|x=0)

The distribution 121A of read-back voltages associated with the cell having the programmed value of 1 can be referred to as P(y|x=1). P(y|x=1) denotes the probability distribution of y given that x=1; in FIG. 1A, P(y|x=1) denotes the probability distribution of read-back voltages (i.e., y) given that the single level cell (SLC) was programmed with the value of 1 (i.e., x=1). The mean 131A (i.e., mean(y|x=1)) represents the average voltage for the distribution 121A of read-back voltages given that the SLC was programmed with the value of 1. The mean 131A (i.e., mean(y|x=1)) can be represented as $V_1$, such that:

$V_1$=mean(y|x=1)

Still referring to FIG. 1A, the programmed threshold voltage 110 is used for determining whether a particular read-back voltage will be read as a 1 or a 0 for an SLC. That is, for an SLC, if a read-back voltage is less than the threshold voltage 110, the cell will be read as a 1; if the read-back voltage is greater than the threshold voltage 110, the cell will be read as a 0. As shown in FIG. 1A, the programmed threshold voltage 110 can be initially programmed as the average of mean 130A (i.e., average read-back voltage for the distribution 120A) and mean 131A (i.e., average read-back voltage for the distribution 121A). The threshold voltage 110 can be represented as $V_{th}$, such that:

$V_{th}=(V_0+V_1)/2$

Additionally, the variance of each distribution of read-back voltages can be computed and/or estimated by approximating the distributions of read-back voltages as a probabilistic and/or statistical distribution (such as the normal (Gaussian) distribution, the t-distribution, the exponential distribution, the F-distribution, the Chi-squared distribution, or the like). The computed or estimated variance of the distributions of read-back voltages can be used as soft information for making soft decisions for improving the accuracy of threshold voltage initialization, acquisition, tracking, prediction, or the like.

While FIG. 1A is associated with a single level cell (SLC), threshold voltages of a multi-level flash cell (MLC) can be described in much the same way as an SLC.

In an MLC, a read-back voltage can be compared against the threshold voltages of the MLC to make a hard decision as to a particular multi-bit value to output. A particular MLC can store and will be read as an n-bit data value, where n is the number of levels of the cell. An MLC can store $2^n$ distinct data values (i.e., a double level cell can store 11, 10, 00, or 01, "Gray coded"). An MLC can have $2^n$ distributions of read-back voltages and $2^n$ mean voltages of the distributions of read-back voltages. An MLC has $2^n-1$ threshold voltages, where n represents the number of levels of the MLC. For example, a double level cell (DLC) will have four mean voltages of the four read-back distributions (each associated with a particular programmed value of the cell) and three threshold voltages as follows:

$V_{11}$=mean(y|x=11)

$V_{10}$=mean(y|x=10)

$V_{00}$=mean(y|x=00)

$V_{01}$=mean(y|x=01)

$V_{11}<V_{10}<V_{00}<V_{01}$ $V_{th1}=(V_{11}+V_{10})/2$ $V_{th2}=(V_{10}+V_{00})/2$ $V_{th3}=(V_{00}+V_{01})/2$ $V_{th1}<V_{th2}<V_{th}$

In an MLC, threshold voltages can be programmed in a similar manner as the threshold voltage 110 of an SLC. In an MLC, a particular threshold voltage can be computed as the average of the mean voltages of two adjacent distributions of read-back voltages. That is, the particular threshold voltage can be computed as the average of the mean voltage for the distribution of read-back voltages immediately below the to-be computed threshold and the mean voltage for the distribution of read-back voltages immediately above the to-be computed threshold.

The threshold voltages of multi-level cells (MLCs) with more than two levels can be programmed as similarly set forth above. For example, in a triple level cell (TLC), which can store a 3-bit value (i.e., 111, 110, 101, 100, 011, 010, 001, or 000), a read-back voltage is compared against seven threshold voltages to make a hard decision as to whether to output 111, 110, 101, 100, 011, 010, 001, or 000. For the read-back voltage of the TLC to be output as a 111, the read-back voltage would be determined to be below the first threshold voltage (i.e., $V_{th1}$); likewise, for the read-back voltage of the TLC to be output as a 110, the read-back voltage would be determined to be between the first threshold voltage (i.e., $V_{th1}$) and the second threshold voltage (i.e., $V_{th2}$); etc. Likewise, this approach can be applied to MLCs with any number of levels. Additionally, stronger error-correction codes (ECCs) with soft decoding can be used for MLC devices to improve accuracy of acquired, tracked, and/or predicted threshold voltages. Soft information can include the log-likelihood ratio (LLR), which can be obtained through multiple measurements of a cell read-back voltages and/or threshold voltages.

Figure 1B:
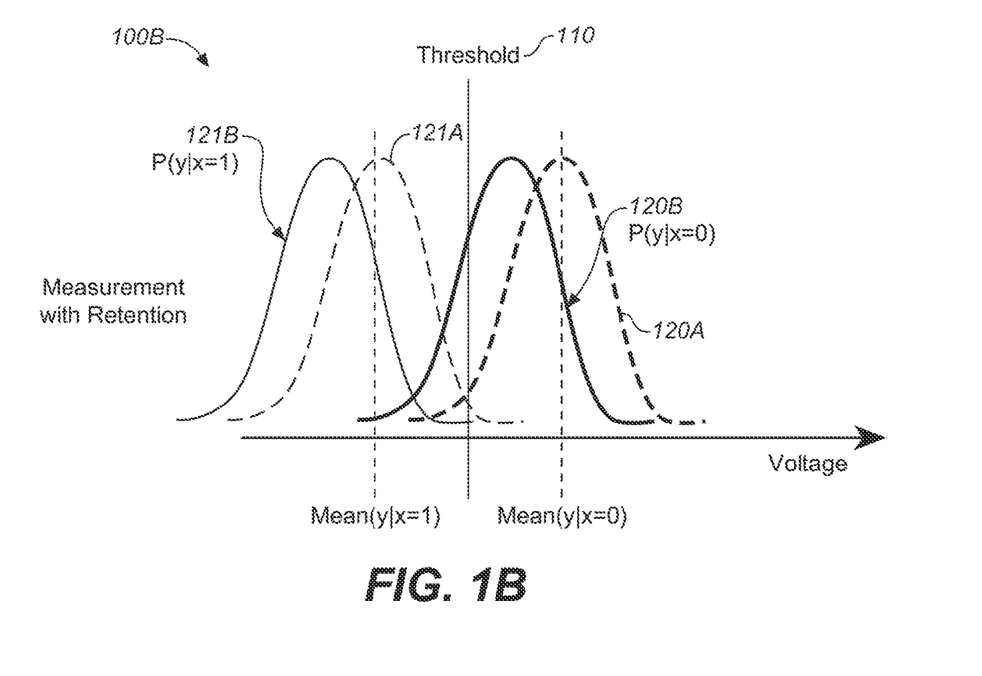
FIG. 1B shows a graphical diagram demonstrating the aging effect on a programmed threshold voltage value of an SLC.

Referring now to FIG. 1B, the aging effect (a/k/a the retention effect) is demonstrated by a graphical diagram 100B of the programmed threshold voltage value 110, the two distributions 120A, 121A of read-back voltages associated with values (i.e., 0 and 1), and two current or drifted distributions 120B, 121B of read-back voltages associated with values (i.e., 0 and 1) of the SLC. Due to time, the number of read-back and program-erase cycles, particular flash wafer, and temperature changes, the average read-back voltages associated with a cell can drift such that the actual read-back voltage distributions drift 120B, 121B and the actual threshold voltage drifts. As depicted in FIG. 1B, the initially programmed threshold voltage 110 will produce less accurate outputs because the two actual (i.e., drifted) distributions 120B, 121B of read-back voltages associated with values (i.e., 0 and 1) of the SLC have drifted away from the two initial distributions 120A, 121A of read-back voltages. Because of this drift, there will be an increase in the probability that the SLC is incorrectly read as 1, when the cell was programmed as a 0.

Because of the aging effect, it is critical to be able to acquire an accurate measure of the current distributions of read-back voltages and the actual threshold voltage(s) so that the threshold voltage(s) can be accurately predicted, tracked, initialized, programmed, and/or reprogrammed. Additionally, it can be advantageous to track or predict an accurate measure of the threshold voltage(s). Furthermore, it can be advantageous or necessary to acquire an accurate measure of the actual threshold value when there is no information as to how the threshold voltage(s) was previously programmed.

Figure 2:
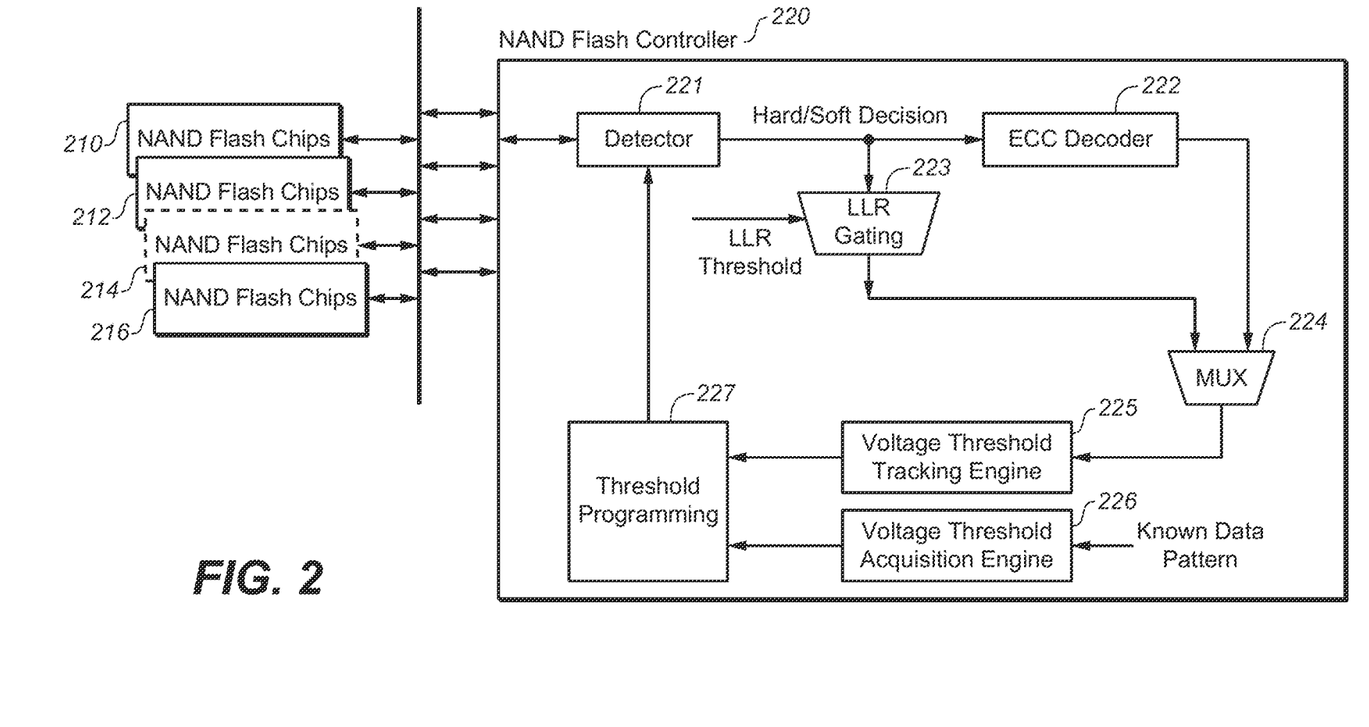
FIG. 2 shows an embodied NAND flash system.

Referring to FIG. 2, an embodied NAND flash system 200 is shown. The flash system 200 can include one or more NAND flash modules 210, 212, 214, 216 and a flash controller 220. Each NAND flash module can include one or more NAND flash chips. The NAND flash modules 210, 212, 214, 216 can be operatively and communicatively coupled to the flash controller 220.

The flash controller 220 can be configured to read, program, and/or erase the one or more flash modules 210, 212, 214, 216. The NAND flash system 200 can be configured for adaptively acquiring and tracking one or more threshold voltages of each flash cell of the one or more NAND flash modules 210, 212, 214, 216. The flash controller 220 can further be communicatively and operatively coupled to one or more other hardware components of a system topology, such as a host system, a cache system, a cache system controller, a storage system, a storage system controller, a storage device, a processor, a bus, a buffer, an expander, a router, a network, or the like. The flash controller 220 can include a detector module 221, an ECC (error correcting code) decoder module 222, an LLR gating module 223, a multiplexer 224, a voltage threshold tracking engine 225, a voltage threshold acquisition engine 226, a threshold programming module 227, or the like.

The detector module 221 of the flash controller 220 can be configured to receive read-back electric signals from the cells of the one or more flash modules 210, 212, 214, 216. The detector module can include one or more processing units or integrated circuits. The detector module 221 can be configured to detect or measure the voltage of the read-back electric signals. The detector module 221 can further be configured to send or pass the measurement of the read-back electric signals to other components (such as the ECC decoder module 222, the LLR gating module 223, or the like) of the flash controller 220 as read-back voltages for making hard and/or soft decisions. The detector module 221 can further be configured to compare the voltage of the read-back voltage to the most current programmed threshold voltage(s) to make a hard decision as to the read/output value of a particular cell.

The ECC decoder module 222 can be configured to receive input signals from the detector module 221 and send or pass output signals to the multiplexer 224. The ECC decoder module 222 can be configured to decode an error-correcting code. The ECC decoder module 222 can determine whether an error-correcting code associated with one or more read-back voltages from a particular cell decodes to the correct data value written to the particular cell. The ECC decoder module 222 can be configured to perform hard or soft decoding. For example, the ECC decoder module 222 can be configured to perform soft Reed-Solomon decoding, soft BCH (Bose, Chaudhuri, and Hocquenghem) decoding, low density parity check (LDPC) decoding, or the like.

The LLR gating module 223 can be configured to receive input from the detector module 221 and send or pass output signals to the multiplexer 224. The LLR gating module 223 can be configured to use and/or generate soft information to perform LLR gating to determine whether read-back voltages are reliable. The LLR gating module 223 can determine the accuracy of a hard decision. For example, the LLR gating module 223 can be configured to compare an LLR value from a read-back voltage against an LLR threshold to determine if the hard decision associated with the read-back voltage is reliable.

The multiplexer 224 can be configured to receive a plurality of inputs from the LLR gating module 223 and the ECC decoder module 222. The multiplexer 224 can be configured to send a coalesced output to the voltage threshold tracking engine 225. The multiplexer 224 can be configured to combine multiple signals into a single data channel.

The voltage threshold tracking engine 225 can be configured to receive input from the multiplexer 224 or storage and send or pass output signals to the threshold programming module 227. The voltage threshold tracking engine 225 can be configured to perform operations and processes necessary for voltage threshold tracking. The voltage threshold tracking engine 225 can include a processor or processing module and/or other components.

The voltage threshold acquisition engine 226 can be configured to receive input from the multiplexer 224 or storage and send or pass output signals to the threshold programming module 227. The voltage threshold acquisition engine 226 can be configured to perform operations and processes necessary for voltage threshold acquisition.

The threshold programming module 227 can be configured to receive inputs from the voltage threshold acquisition engine 226 and the voltage threshold tracking engine 225. The threshold programming module 227 can be configured to send output signals to the detector module 221. The threshold programming module 227 can be configured to perform operations and processes necessary for programming threshold voltages.

Embodiments of the invention can include methods for acquiring the threshold voltage and tracking the threshold voltage change due to the aging effect. The methods for acquiring the threshold voltage and tracking the threshold voltage change can be used for improving LLR quality for soft decoding in an NAND flash memory device. Embodiments of the methods for acquiring the threshold voltage can be performed by a flash memory controller operating in threshold voltage acquisition mode.

Embodiments of the invention can include threshold voltage initialization of an SLC or MLC flash cell. A user, hardware (such as a flash controller 220 or a component of the flash controller 220), software, or process can program known data patterns (e.g., x as used in describing FIGS. 1A and 1B, above) into one or more cells. The known data patterns can be written at the end of a memory page (or elsewhere in a page), and a circuit can read this known data pattern during idle time to self-adapt the threshold voltage. The known data patterns can comprise a large set of data values, such as hundreds, thousands, or more of data values. The read-back voltages can be fine resolution read-back voltages, such as those used with MLCs. Then, the read-back voltages of the one or more cells (e.g., y as used in describing FIGS. 1A and 1B, above) can be detected and/or received. The read-back voltages can then be used to obtain two or more distributions of read-back voltages. For example, in an SLC, two initial distributions can be obtained P(y|x=0) and P(y|x=1) from the read-back voltages corresponding to the known data patterns. The particular threshold voltage can then be calculated and/or set as the average of the means of two adjacent distributions of read-back voltages. For example, in the SLC the threshold voltage can be calculated and set as $V_{th(init)} = (\text{mean}(y|x=0) + \text{mean}(y|x=1))/2$.

In an SLC, initial variance can be set as:
$\text{Var}_{init}(x=m) = \text{mean}[(y'-\text{mean}(y|x=m))^2]$, where m refers to an 1-bit programmed data value (i.e., 0 or 1 in an SLC), and where $y' = (\text{minimum\_voltage} + V_{th(init)})/2$ for m=1 and where $y' = (\text{maximum\_voltage} + V_{th(init)})/2$ for m=0.

In an MLC, the initial variance can be set as:
$\text{Var}_{init}(x=m) = \text{mean}[(y'-\text{mean}(y|x=m))^2]$, where m refers to an n-bit programmed data value (such as, 11, 10, 00, or 01 in a DLC), where $y' = (\text{minimum\_voltage} + V_{th(init)})/2$ for m=maximum_n-bit_data_value (such as 11 for a MLC or 111 for a TLC), where $y' = (\text{maximum\_voltage} + V_{th(init)})/2$ for m=minimum_n-bit_data_value (such as 00 for a MLC or 000 for a TLC), and where $y' = (V_{th(2^n-m-1)(init)} + V_{th(2^n-m)(init)})/2$ for all other m. Here, n represents the number of levels of an MLC, and m represents the particular n-bit data value programmed to the cell. In some implementations, y' can be any predetermined value, programmed by a user to be any value, or programmed by a process to be any value.

Based on these initialization parameters (or later acquired parameters), the log-likelihood ratio (LLR) can be estimated as $2y'/\text{Var}_{init}(x=m)$ and can be used for soft decision making.

Additionally, the threshold voltage acquisition method can include reading back and storing all cell voltages corresponding to data values (e.g., 0 and 1 for a SLC, or 11, 10, 00, and 01 for a multi-level cell (MLC), etc.), and then computing the average read-back voltage for each data value.

Furthermore, embodiments of the invention can include adaptive threshold voltage acquisition. Threshold voltages can be adaptively updated, such that every time a cell reads back a voltage, the old or initial average read-back voltage is adjusted based upon the current or new read-back voltage to output an updated average read-back voltage. This adaptive threshold voltage acquisition can be performed iteratively. A flash controller 220 configured to perform the adaptive threshold voltage acquisition method can "blindly" determine threshold voltage values based upon any initial values for any NAND flash chip, regardless of whether or not the flash controller has any other data about the NAND flash chip. Performing the method for adaptive threshold voltage acquisition allows the flash controller 220 to dynamically adapt to and be used for any NAND flash chips, which eliminates the need for a flash controller to be specially calibrated or receive special programming to accommodate a particular NAND flash chip.

For example, for an SLC, the threshold voltage can be obtained adaptively by iteratively updating the current mean voltages, i.e., $V_0$ and $V_1$, of the read-back voltage distributions 120A, 121A, each corresponding to the cell's bit-value being 0 or 1, respectively. The first step can include determining or obtaining the initial (or most recent) mean voltages (i.e., $V_0$ and $V_1$) of the read-back voltage distributions 120A, 121A, as previously described herein. If further threshold voltage acquisition has not occurred after the threshold voltage initialization, the initial mean voltages (i.e., $V_{0(init)}$ and $V_{1(init)}$ of the read-back voltage distributions can be used for the first iteration of the adaptive threshold voltage acquisition.

Secondly, the adaptive threshold acquisition method can include performing at least one iterative update cycle. The iterative update cycle can be performed every time a cell voltage is read back or selectively depending, for example, on the mode the flash controller is operating in or system performance requirements. Continuing the above example for the SLC, if the read-back value of the cell corresponds to the cell's bit value being read as a 0, the mean voltage, i.e., $V_0$ of the read-back voltage distribution 120A, can be updated by performing at least one iteration of averaging the new read-back voltage with the mean voltage $V_0$ according to the following equation:

$$V_{0(updated)} = (V_{0(old)} + v_{(new\ read-back)})/2$$

Similarly, if the read-back value of the cell corresponds to the cell's bit value being read as a 1, the mean voltage, i.e., $V_1$ of the read-back voltage distribution 121A, can be updated by performing at least one iteration of averaging the new read-back voltage with the mean voltage $V_1$ according to the following equation:

$$V_{1(updated)} = (V_{1(old)} + V_{(new\ read-back)})/2$$

The at least one iterative update cycle can be performed until all of the cells have been exercised.

In some embodiments, performing at least one iterative update cycle of the adaptive threshold acquisition method can include using an update gain, η ("eta"). The update gain, q, can be programmable. The update gain is a linear predictor, which can include a small offset scalar such as 0.01 or 0.001.

The update gain can be incorporated into the above example for the SLC. If the read-back value of the cell corresponds to the cell's bit value being read as a 0, the mean voltage, i.e., $V_0$, of the read-back voltage distribution 120A, can be updated by performing at least one iteration of adjusting the old mean voltage, $V_0$, based upon the product of the update gain and the difference between the old mean voltage (i.e., $V_0$) and the new read-back voltage, such as through the following:

$$V_{0(updated)} = V_{0(old)} + (\text{error}) * \eta, \text{ where error} = V_{0(old)} - v_{(new\ read-back)}$$

Similarly, if the read-back value of the cell corresponds to the cell's bit value being read as a 1, the mean voltage, i.e., $V_1$ of the read-back voltage distribution 121A, can be updated by performing at least one iteration of adjusting the old mean voltage, $V_1$, based upon the product of the update gain and the difference between the old mean voltage (i.e., $V_1$) and the new read-back voltage, such as through the following:

$$V_{1(updated)} = V_{1(old)} + (\text{error}) * \eta, \text{ where error} = V_{1(old)} - v_{(new\ read-back)}$$

Thirdly, the adaptive threshold voltage acquisition method includes determining the updated threshold voltage based upon updated mean voltages (e.g., $V_{0(updated)}$ and $V_{1(updated)}$). The updated threshold voltage acquisition can be computed as follows:

$$V_{th(updated)} = (V_{0(updated)} + V_{1(updated)})/2$$

While an implementation of the adaptive threshold voltage acquisition method has been described as specifically applied to an SLC, one of ordinary skill in the art will readily understand the application of the disclosed adaptive threshold voltage acquisition method as it can be applied to MLCs.

Embodiments of the invention can also include methods for dynamically tracking the threshold voltage of flash cells. Threshold voltages can be automatically tracked over the life of the flash memory. Because of the aging effect, flash cells will leak electrons over time and/or program-erase cycles, and the read-back voltages of flash cells will decrease as the electrons leak out. Therefore, it would be advantageous to track read-back voltages and/or voltage thresholds over the life of the flash cells. Embodiments of the methods for tracking the threshold voltage can be performed by a flash controller 220 operating in threshold voltage tracking mode.

Embodiments of invention can include one or more of several methods for tracking the threshold voltage. A first method for tracking the threshold voltage is based upon or includes known data patterns. A second method for tracking the threshold voltage is based upon or includes ECC decoding output. A third method for tracking the threshold voltage is based upon or includes LLR gating.

The first method for tracking the threshold voltage can be based upon or include the use of known data patterns. NAND flash chips each have many spare cells. The method for tracking the threshold voltage can include writing known data patterns to one or more spare cells. After the known data patterns are written to the spare cells, the method for tracking the known data pattern can include reading back the voltages of each spare cell (each corresponding to a certain bit pattern) and then adjusting the threshold voltage as described in the method for adaptively acquiring the threshold voltage based upon the initial threshold voltage.

Figure 3A:
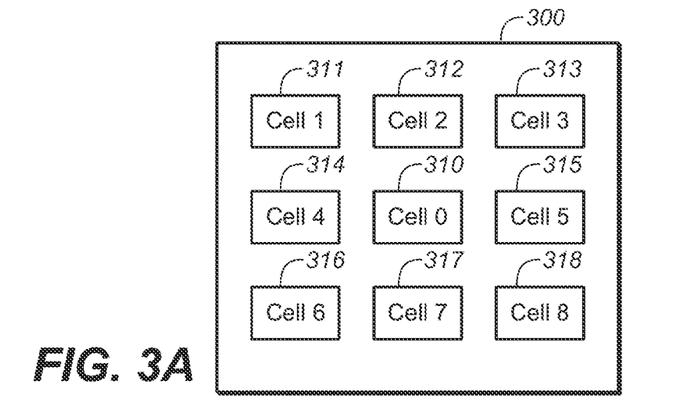
FIG. 3A shows a center cell and spare neighbor cells of a flash chip.
Figure 3B:
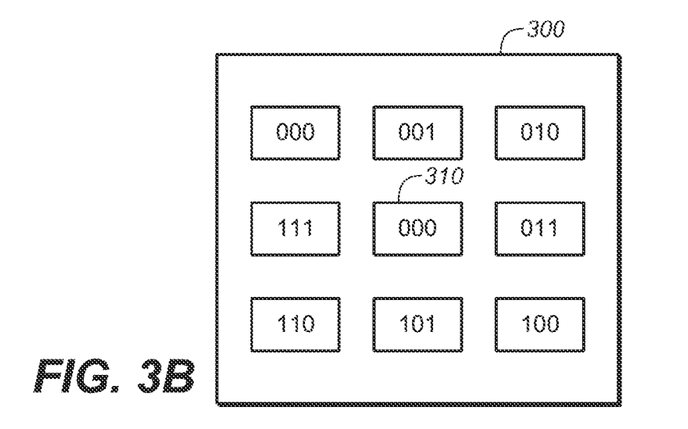
FIG. 3B shows a center cell and spare neighbor cells with the spare neighbor cells having a first particular data pattern.
Figure 3C:
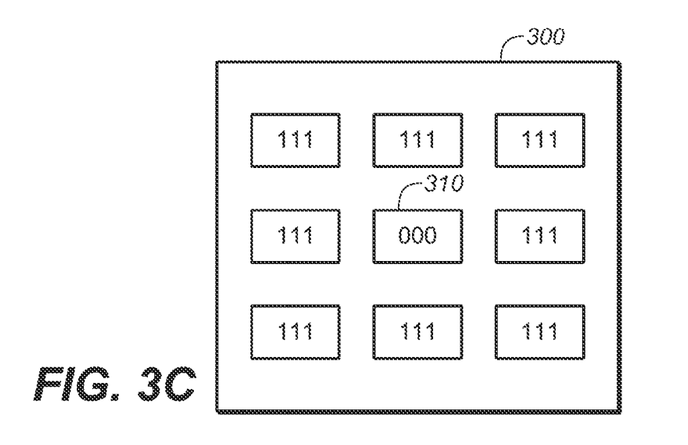
FIG. 3C shows a center cell and spare neighbor cells with the spare neighbor cells having a second particular data pattern.

Furthermore, referring to FIGS. 3A-C, writing known data patterns to spare flash cells can include writing one or more known data patterns to spare neighbor cells. By writing known data patterns to spare neighbor cells, the accuracy of threshold voltage tracking and acquisition can be improved to take into account the effects of inter-cell interference on read-back voltages and threshold-voltages. Inter-cell interference occurs when the read-back voltage and/or threshold voltage of a particular cell is affected by program-erase cycles to the particular cell's neighbor cells and the neighbor cells' stored data-values. Referring to FIG. 3A, a plurality of flash cells 310-318 of an NAND flash chip 300 is depicted. The center cell 310 is surrounded by neighbor cells 311-318. All of the neighbor cells 311-318 will interfere with the center cell 310. The neighbor cells 311-318 will cause inter-cell interference with the center cell 310 differently based upon the particular data patterns that are written to the neighbor cells 311-318. Referring to FIGS. 3B and 3C, two possible exemplary data patterns for the neighbor cells 311-318 surrounding the center cell 310 of a triple-level cell 300 are depicted. For example, in FIG. 3B each of the neighbor cells 311-318 have been programmed with a distinct 3-bit data value (i.e., 111, 110, etc.); whereas in FIG. 3C, each of the neighbor cells have been programmed with the same data value such that each of the neighbor cells has the data-value of 111. Multiple distinct iterations of writing known data patterns to spare neighbor cells can be performed to obtain a more accurate initial threshold voltage(s) for the center cell. For example, iterations of writing known data patterns to spare neighbor cells could be performed for every distinct combination of data patterns to obtain a more accurate average initial threshold value which takes into account inter-cell interference for the distinct combinations of data patterns.

Furthermore, two or more representative iterations of writing known data patterns to spare neighbor cells can be performed to obtain an average initial threshold voltage which takes into account inter-cell interference. For example in a TLC, a first iteration of writing known data patterns to spare neighbor cells 311-318 of the center cell can include programming every spare neighbor cell 311-318 as 111 (such as shown in FIG. 3C), and a second iteration of writing known data patterns to spare neighbor cells 311-318 of the center cell can include programming every spare neighbor cell as 000. The initial threshold voltages obtained from the two representative iterations could then be averaged to provide a more accurate initial threshold voltage which takes into account inter-cell interference without requiring the performance of a very high number of iterations.

The effect of the inter-cell interference can also be incorporated into soft information (such as the LLR threshold) and the initial variance parameter, by using an average initial threshold voltage which takes into account inter-cell interference in the y' parameter. For example in an SLC, y' can include the average initial threshold voltage of when the cell is surrounded by neighbor cells written with all 1s and when the cell is surrounded by neighbor cells written with all 0s. If the y' parameter includes a threshold voltage which incorporates the inter-cell interference effect, both initial variance and LLR threshold parameters will include a measure of the effects of inter-cell interference because the initial variance and LLR threshold parameters are based in part upon the y' parameter (as shown above).

More accurate estimates of the variance can be obtained by performing more iterations of writing other known data patterns to spare neighbor cells.

Additionally, in some embodiments writing known data patterns to spare flash cells can include writing one or more known random data patterns to spare neighbor cells. In these embodiments, the flash controller 220 or a component of the flash controller 220 can be configured to produce random distributions of data patterns to be written to spare neighbor cells. In some implementations, the produced random data patterns can be stored in the controller until the initial variance is obtained so that the effect of inter-cell interference can be correlated to or weighted based upon particular data patterns, which can be useful for other flash cell metrics. Writing one or more known random data patterns to spare neighbor cells can be performed by a random n-bit number generator module or sub-module of the flash controller 220.

Including a measurement of the inter-cell interference in the variance also improves the accuracy and reliability for soft decision making because variance is a component of the log-likelihood ratio (LLR). The first method for tracking the threshold voltage can be based upon or include the use of known data patterns and can be used to counter the aging effect and the inter-cell interference effect.

The second method for tracking the threshold voltage can be based upon or include the use of output from ECC decoding. If ECC decoding of read-back voltages results in a sector convergence such that the correct data pattern is output from the ECC decoding, this correct data pattern is known to be the actual bit pattern written to the cells. This correct data pattern can be used as a known data pattern to adjust the voltage threshold as described in the method for adaptively acquiring the threshold voltage. Using the correct data patterns acquired from ECC decoding can be used to counter the aging effect and the impact of program-erase cycles.

The third method for tracking the threshold voltage can be based upon or include the use of LLR-gating (log-likelihood ratio gating). LLR-gating can use available soft information to adapt or update the threshold voltage such that the threshold voltage is only updated when the soft information indicates that the read-back voltages are reliable; if the soft information indicates that the read-back voltages are not reliable, the adaptation (i.e., adjustment) will not be performed to the threshold voltage based upon the particular read-back voltages which are unreliable.

The third method can include programming an LLR threshold. The LLR threshold can be set as $2y'/Var_{init}(x=m)$ (as described above). The method can then include, for each cell, comparing the read-back voltage to generate hard information (i.e., whether to read the cell as a 0 or 1) and soft information (e.g., a LLR) for each cell. The method can further include comparing the LLR generated by the detector with the LLR threshold for each cell. If the generated LLR is larger than the LLR threshold, the read-back voltage should be determined to be reliable, and threshold voltage adaptation should be performed to adjust the threshold voltage based upon the corresponding bit pattern. On the other hand, if the generated LLR is less than the LLR threshold, the read-back voltage should be determined to be unreliable, and current threshold voltage should not be adjusted. The steps of this method can be repeated until all of the cells are exercised.

In an NAND flash life cycle, the adaptive circuit disclosed herein can be used to automatically track threshold voltage to reduce decision errors.

Figure 4:
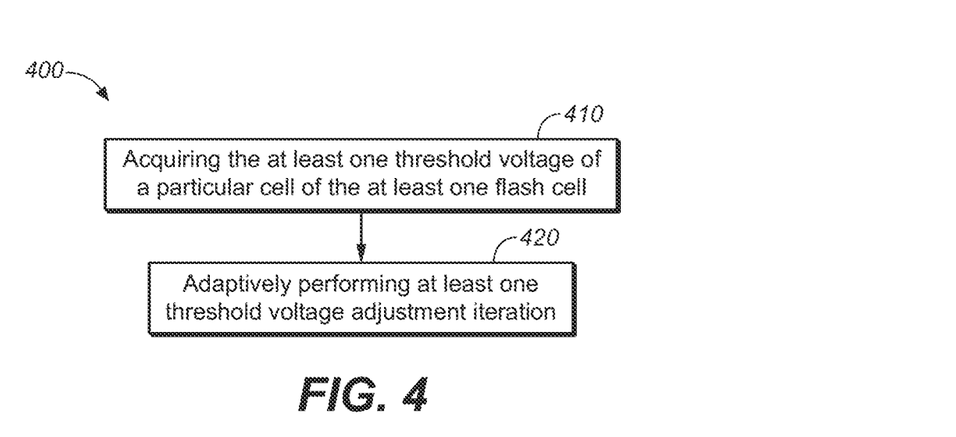
FIG. 4 shows a method for acquiring and tracking at least one threshold voltage of at least one cell of at least one flash chip.

Referring to FIG. 4, an embodied method 400 for acquiring and tracking at least one threshold voltage of at least one cell of at least one flash chip is depicted. It is contemplated that embodiments of the method 400 can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 400 can include any or all of steps 410 or 420, and it is contemplated that the method 400 can include additional steps as disclosed throughout, but not explicitly set forth in this paragraph. Further, it is fully contemplated that the steps of the method 400 can be performed concurrently or in a non-sequential order. Likewise, it is fully contemplated that the method 400 can be performed prior to, subsequent to, or in combination with the performance of one or more steps of one or more other embodied methods disclosed throughout.

The method 400 can include a step 410, wherein the step 410 includes acquiring the at least one threshold voltage of a particular cell of the at least one flash cell.

The method 400 can include a step 420, wherein the step 420 includes adaptively performing at least one threshold voltage adjustment iteration.

Figure 5:
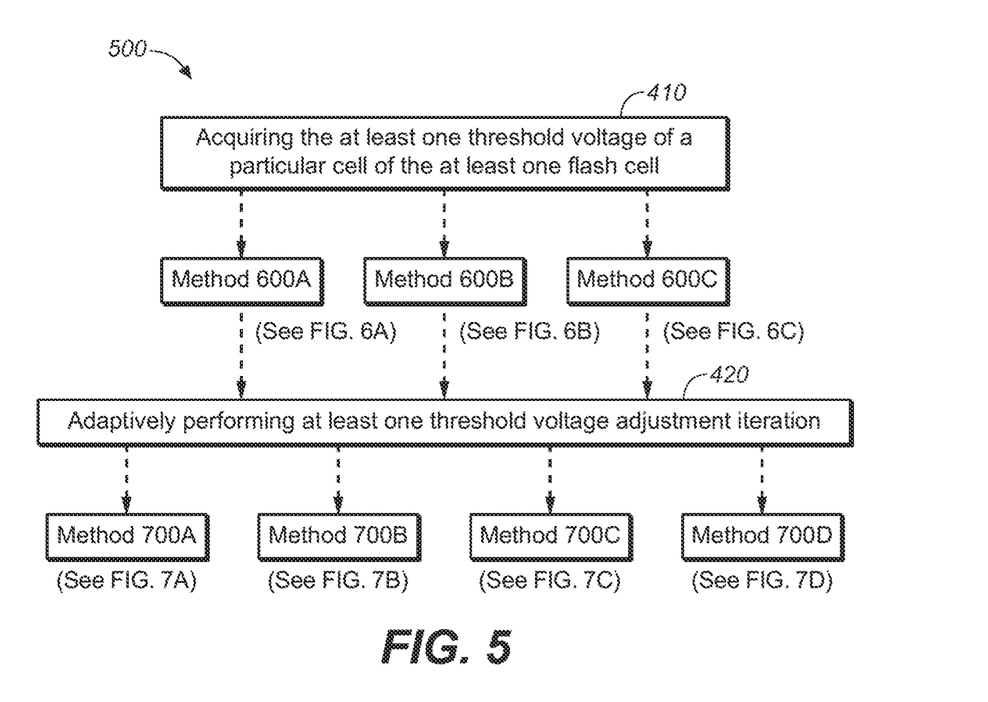
FIG. 5 shows a method-tree for one or more methods for acquiring and tracking at least one threshold voltage.

Referring to FIG. 5, an embodied method 500 for acquiring and tracking at least one threshold voltage of at least one cell of at least one flash chip is depicted. It is contemplated that embodiments of the method 500 can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 500 can include any or all of steps 410 or 420, as well as embodied methods 600A, 600B, 600C, 700A, 700B, 700C, and/or 700D; and it is contemplated that the method 500 can include additional steps as disclosed throughout, but not explicitly set forth in this paragraph. Further, it is fully contemplated that the steps of the method 400 can be performed concurrently or in a non-sequential order. Likewise, it is fully contemplated that the method 400 can be performed prior to, subsequent to, or in combination with the performance of one or more steps of one or more other embodied methods, such as embodied methods 600A, 600B, 600C, 700A, 700B, 700C, and/or 700D, disclosed throughout.

The method 500 can include a step 410, wherein the step 410 includes acquiring the at least one threshold voltage of a particular cell of the at least one flash cell.

The step 410 of the method 500 can comprise or further include one or more steps of the methods 600A, 600B, and/or 600C. (See FIGS. 6A-6C, respectively, as described below).

The method 500 can include a step 420, wherein the step 420 includes adaptively performing at least one threshold voltage adjustment iteration.

The step 420 of the method 500 can comprise or further include one or more steps of the methods 700A, 700B, 700C, and/or 700D. (See FIGS. 7A-7D, respectively, as described below).

Figure 6A:
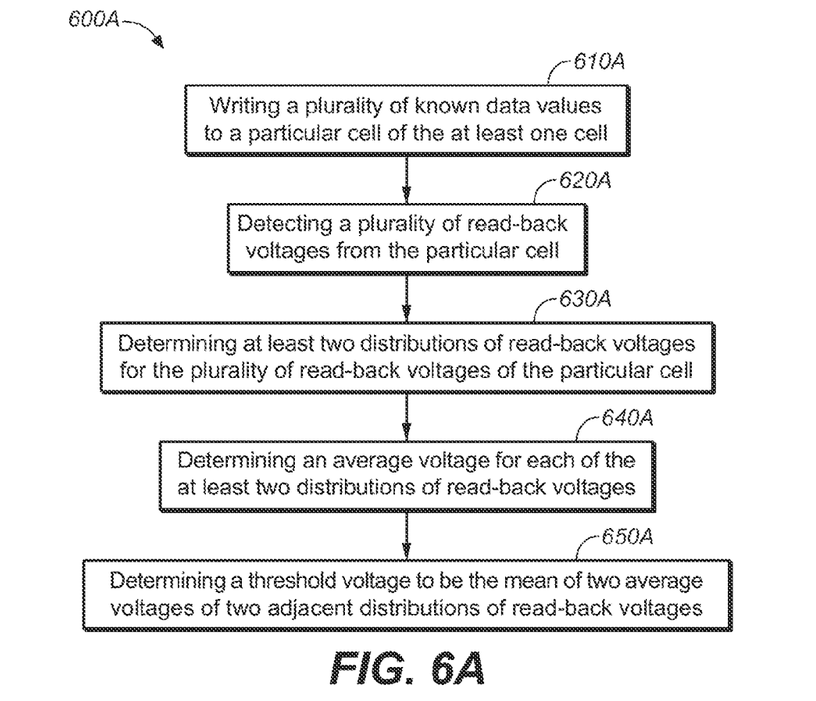
FIGS. 6A-C each shows a particular method for acquiring at least one threshold voltage.

Referring to FIG. 6A, an embodied method 600A for acquiring the at least one threshold voltage of a particular cell of the at least one flash cell is depicted. It is contemplated that embodiments of the method 600A can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 600A can include any or all of steps 610A, 620A, 630A, 640A, or 650A, and it is contemplated that the method 600A can include additional steps as disclosed throughout, but not explicitly set forth in this paragraph. Further, it is fully contemplated that the steps of the method 600A can be performed concurrently or in a non-sequential order. Likewise, it is fully contemplated that the method 600A can be performed prior to, subsequent to, or in combination with the performance of one or more steps of one or more other embodied methods disclosed throughout.

The method 600A can include a step 610A, wherein the step 610A includes writing a plurality of known data values to a particular cell of the at least one cell.

The method 600A can include a step 620A, wherein the step 620A includes detecting a plurality of read-back voltages from the particular cell.

The method 600A can include a step 630A, wherein the step 630A includes determining at least two distributions of read-back voltages for the plurality of read-back voltages of the particular cell. The at least two distributions can include at least a first distribution of read-back voltages and a second distribution of read-back voltages. The first distribution of read-back voltages is a distribution of read-back voltages given that a first particular data value was written to the particular cell. The second distribution of read-back voltages is a distribution of read-back voltages given that a second particular data value was written to the particular cell. The first and second distributions of read-back voltages are adjacent, wherein adjacent distributions do not have any intervening distribution between the two adjacent distributions. (For example, for a double-level cell, a read-back voltage distribution corresponding to a write value of 11 would not be adjacent to a read-back voltage distribution for a write value of 00 because the distribution for the write values of 10 would be between the read-back voltage distributions corresponding to write values of 11 and 00).

The method 600A can also include a step 640A, wherein the step 640A includes determining an average voltage for each of the at least two distributions of read-back voltages.

The method 600A can further include a step 650A, wherein the step 650A includes determining a threshold voltage to be the mean of two average voltages of two adjacent distributions of read-back voltages.

Figure 6B:
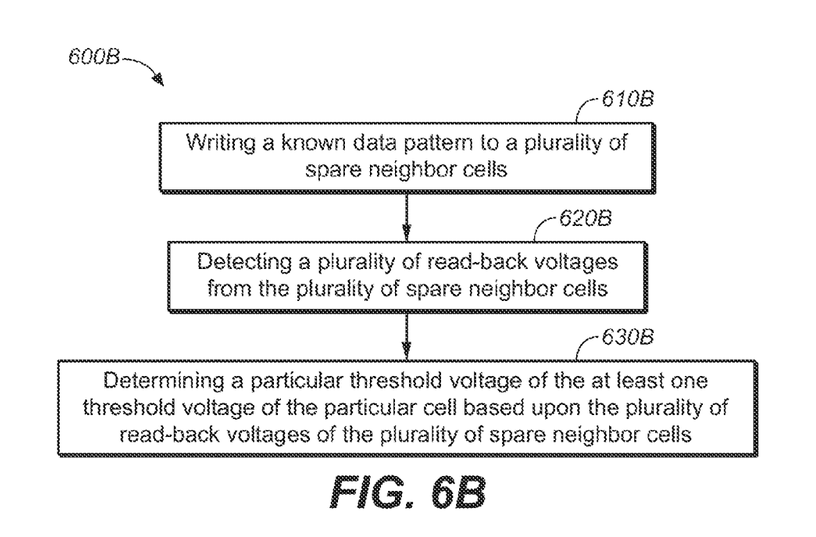

Referring now to FIG. 6B, an embodied method 600B for acquiring the at least one threshold voltage of a particular cell of the at least one flash cell is depicted. It is contemplated that embodiments of the method 600B can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 600B can include any or all of steps 610B, 620B, or 630B, and it is contemplated that the method 600B can include additional steps as disclosed throughout, but not explicitly set forth in this paragraph. Further, it is fully contemplated that the steps of the method 600B can be performed concurrently or in a non-sequential order. Likewise, it is fully contemplated that the method 600B can be performed prior to, subsequent to, or in combination with the performance of one or more steps of one or more other embodied methods disclosed throughout.

The method 600B can include a step 610B, wherein the step 610B includes writing a known data pattern to a plurality of spare neighbor cells. The plurality of spare neighbor cells can be adjacent to a particular cell of the at least one flash chip.

The method 600B can include a step 620B, wherein the step 620B includes detecting a plurality of read-back voltages from the plurality of spare neighbor cells.

The method 600B can include a step 630B, wherein the step 630B includes determining a particular threshold voltage of the at least one threshold voltage of the particular cell based upon the plurality of read-back voltages of the plurality of spare neighbor cells. In some implementations, the step 630B can further include determining a particular threshold voltage of the at least one threshold voltage of the particular cell based upon the plurality of read-back voltages of the plurality of spare neighbor cells such that the particular threshold voltage accounts for the effect of inter-cell interference.

Figure 6C:
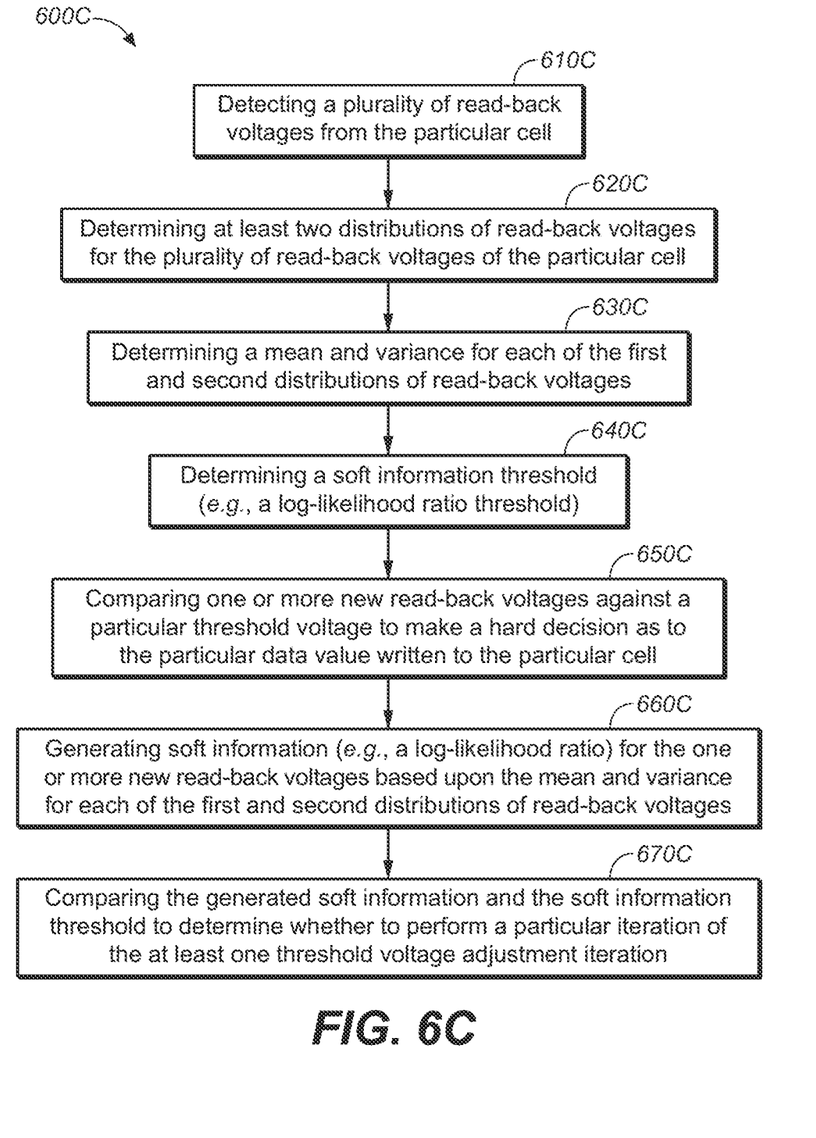

Referring now to FIG. 6C, the embodied method 600C for acquiring or tracking the at least one threshold voltage of a particular cell of the at least one flash cell is depicted. It is contemplated that embodiments of the method 600C can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 600C can include any or all of steps 610C, 620C, 630C, 640C, 650C, 660C, or 670C, and it is contemplated that the method 600C can include additional steps as disclosed throughout, but not explicitly set forth in this paragraph. Further, it is fully contemplated that the steps of the method 600C can be performed concurrently or in a non-sequential order. Likewise, it is fully contemplated that the method 600C can be performed prior to, subsequent to, or in combination with the performance of one or more steps of one or more other embodied methods disclosed throughout.

The method 600C can include a step 610C, wherein the step 610C includes detecting a plurality of read-back voltages from the particular cell.

The method 600C can include a step 620C, wherein the step 620C includes determining at least two distributions of read-back voltages for the plurality of read-back voltages of the particular cell. The at least two distributions can include at least a first distribution of read-back voltages and a second distribution of read-back voltages. The first distribution of read-back voltages is a distribution of read-back voltages given that a first particular data value was written to the particular cell, and the second distribution of read-back voltages is a distribution of read-back voltages given that a second particular data value was written to the particular cell.

The method 600C can also include a step 630C, wherein the step 630C includes determining a mean and variance for each of the first and second distributions of read-back voltages.

The method 600C can further include a step 640C, wherein the step 640C includes determining a soft information threshold (e.g., a log-likelihood ratio threshold).

The method 600C can include a step 650C, wherein the step 650C includes comparing one or more new read-back voltages against a particular threshold voltage to make a hard decision as to the particular data value written to the particular cell.

The method 600C can include a step 660C, wherein the step 660C includes generating soft information (e.g., a log-likelihood ratio) for the one or more new read-back voltages based upon the mean and variance for each of the first and second distributions of read-back voltages. The soft information can improve the accuracy of determining a particular data value written to the particular cell. This soft information can be used by an error-correcting code decoder.

The method 600C can also include a step 670C, wherein the step 670C includes comparing the generated soft information and the soft information threshold to determine whether to perform a particular iteration of the at least one threshold voltage adjustment iteration.

Figure 7A:
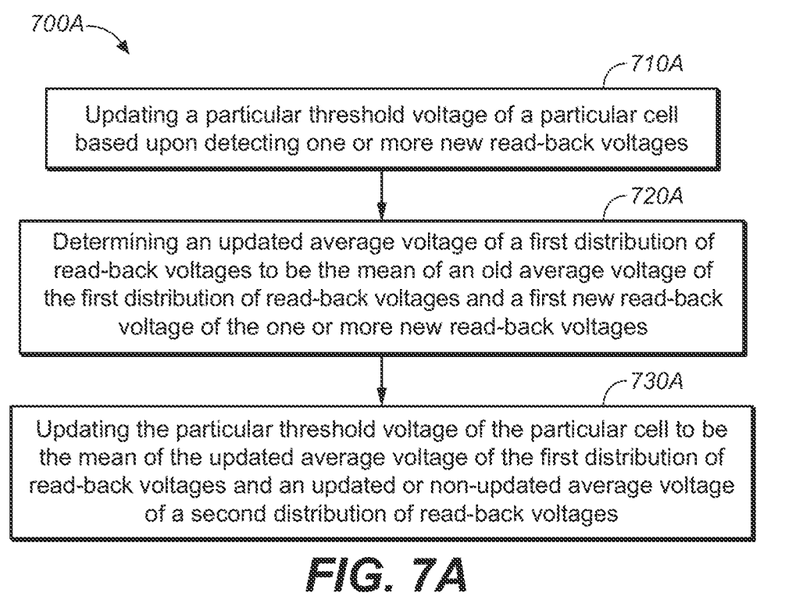
FIGS. 7A-D each shows a particular method for adaptively performing at least one threshold voltage adjustment iteration.

Referring now to FIG. 7A, the embodied method 700A for adaptively performing at least one threshold voltage adjustment iteration is depicted. It is contemplated that embodiments of the method 700A can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 700A can include any or all of steps 710A, 720A, or 730A, and it is contemplated that the method 700A can include additional steps as disclosed throughout, but not explicitly set forth in this paragraph. Further, it is fully contemplated that the steps of the method 700A can be performed concurrently or in a non-sequential order. Likewise, it is fully contemplated that the method 700A can be performed prior to, subsequent to, or in combination with the performance of one or more steps of one or more other embodied methods disclosed throughout.

The method 700A can include a step 710A, wherein the step 710A includes updating a particular threshold voltage of a particular cell based upon detecting one or more new read-back voltages. In some implementations, the step 710A can further include or can comprise any or all of steps 720A or 730A, described below.

The method 700A can also include a step 720A, wherein the step 720A includes determining an updated average voltage of a first distribution of read-back voltages to be the mean of an old average voltage of the first distribution of read-back voltages and a first new read-back voltage of the one or more new read-back voltages. The first distribution of read-back voltages is a distribution of read-back voltages given that a first particular data value was written to a particular cell, and the first new read-back voltage is associated with the first particular data value being written to the particular cell.

The method 700A can also include a step 730A, wherein the step 730A includes updating the particular threshold voltage of the particular cell to be the mean of the updated average voltage of the first distribution of read-back voltages and an updated or non-updated average voltage of a second distribution of read-back voltages. The second distribution of read-back voltages is adjacent to the first distribution of read-back voltages.

Figure 7B:
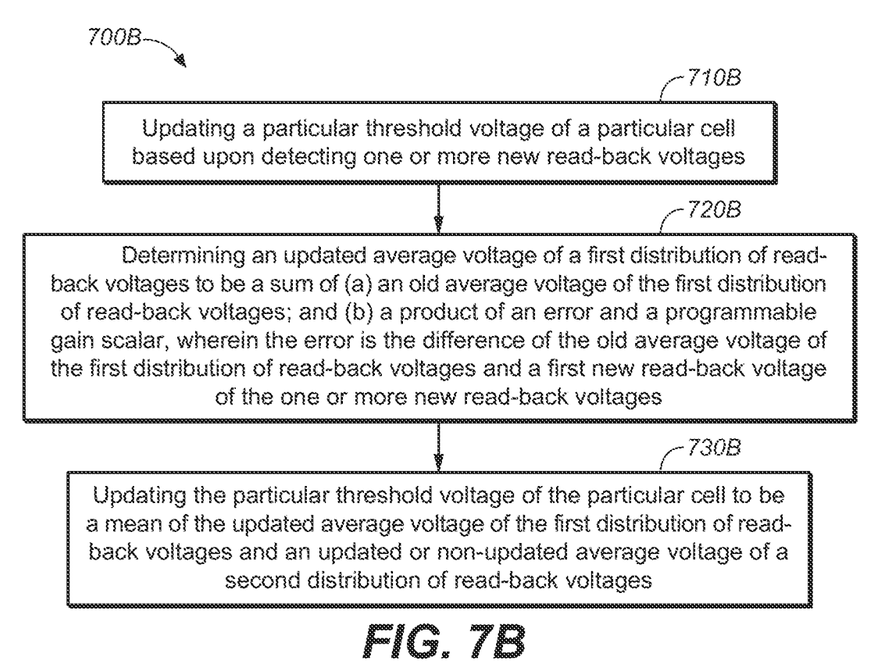

Referring now to FIG. 7B, the embodied method 700B for adaptively performing at least one threshold voltage adjustment iteration is depicted. It is contemplated that embodiments of the method 700B can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 700B can include any or all of steps 710B, 720B, or 730B, and it is contemplated that the method 700B can include additional steps as disclosed throughout, but not explicitly set forth in this paragraph. Further, it is fully contemplated that the steps of the method 700B can be performed concurrently or in a non-sequential order. Likewise, it is fully contemplated that the method 700B can be performed prior to, subsequent to, or in combination with the performance of one or more steps of one or more other embodied methods disclosed throughout.

The method 700B can include a step 710B, wherein step 710B includes updating a particular threshold voltage of a particular cell based upon detecting one or more new read-back voltages. In some implementations, the step 710B can further include or can comprise any or all of steps 720B or 730B, described below.

The method 700B can also include a step 720B, wherein the step 720B includes determining an updated average voltage of a first distribution of read-back voltages to be a sum of: (a) an old average voltage of the first distribution of read-back voltages; and (b) a product of an error and a programmable gain scalar. The error is the difference of the old average voltage of the first distribution of read-back voltages and a first new read-back voltage of the one or more new read-back voltages. The first distribution of read-back voltages is a distribution of read-back voltages given that a first particular data value was written to a particular cell, and the first new read-back voltage is associated with the first particular data value being written to the particular cell.

The method 700B can also include a step 730B, wherein the step 730B includes updating the particular threshold voltage of the particular cell to be a mean of the updated average voltage of the first distribution of read-back voltages and an updated or non-updated average voltage of a second distribution of read-back voltages. The second distribution of read-back voltages is adjacent to the first distribution of read-back voltages.

Figure 7C:
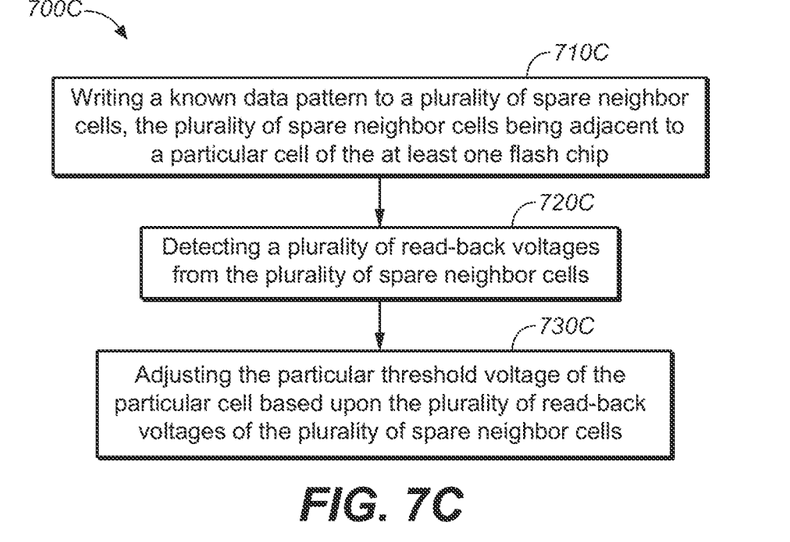

Referring now to FIG. 7C, the embodied method 700C for adaptively performing at least one threshold voltage adjustment iteration is depicted. It is contemplated that embodiments of the method 700C can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 700C can include any or all of steps 710C, 720C, or 730C, and it is contemplated that the method 700C can include additional steps as disclosed throughout, but not explicitly set forth in this paragraph. Further, it is fully contemplated that the steps of the method 700C can be performed concurrently or in a non-sequential order. Likewise, it is fully contemplated that the method 700C can be performed prior to, subsequent to, or in combination with the performance of one or more steps of one or more other embodied methods disclosed throughout.

The method 700C can include a step 710C, wherein the step 710C includes writing a known data pattern to a plurality of spare neighbor cells, the plurality of spare neighbor cells being adjacent to a particular cell of the at least one flash chip.

The method 700C can also include a step 720C, wherein the step 720C includes detecting a plurality of read-back voltages from the plurality of spare neighbor cells.

The method 700C can also include a step 730C, wherein the step 730C includes adjusting the particular threshold voltage of the particular cell based upon the plurality of read-back voltages of the plurality of spare neighbor cells. In some implementations, the step 730C can include adjusting the particular threshold voltage of the particular cell to account for the effect of inter-cell interference based upon the plurality of read-back voltages of the plurality of spare neighbor cells.

Figure 7D:
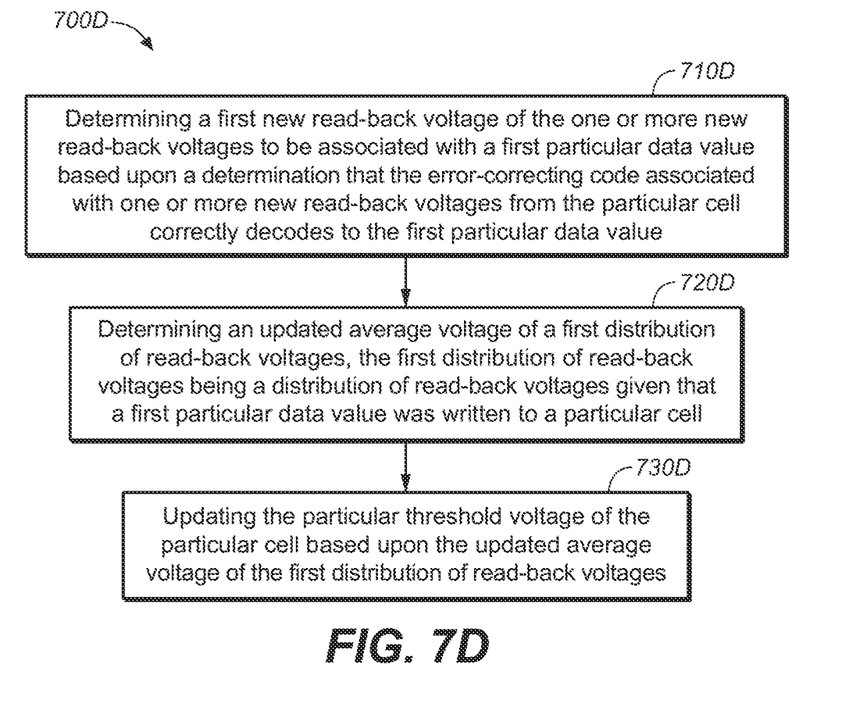

Referring now to FIG. 7D, the embodied method 700D for adaptively performing at least one threshold voltage adjustment iteration is depicted. It is contemplated that embodiments of the method 700D can be performed by a flash memory system 200, a flash controller 220, components or modules of a flash controller 220, software or firmware executed on a computing device (such as a flash controller 220 or a processor), other computing devices, other computer components, or on other software, firmware, or middleware. The method 700D can include any or all of steps 710D, 720D, or 730D, and it is contemplated that the method 700D can include additional steps as disclosed throughout, but not explicitly set forth in this paragraph. Further, it is fully contemplated that the steps of the method 700D can be performed concurrently or in a non-sequential order. Likewise, it is fully contemplated that the method 700D can be performed prior to, subsequent to, or in combination with the performance of one or more steps of one or more other embodied methods disclosed throughout.

The method 700D can include a step 710D, wherein the step 710D includes determining a first new read-back voltage of the one or more new read-back voltages to be associated with a first particular data value based upon a determination that the error-correcting code associated with one or more new read-back voltages from the particular cell correctly decodes to the first particular data value.

The method 700D can also include a step 720D, wherein the step 720D includes determining an updated average voltage of a first distribution of read-back voltages, the first distribution of read-back voltages being a distribution of read-back voltages given that a first particular data value was written to a particular cell.

The method 700D can also include a step 730D, wherein the step 730D includes updating the particular threshold voltage of the particular cell based upon the updated average voltage of the first distribution of read-back voltages.

It is believed that the present invention and many of its attendant advantages will be understood by the foregoing description, and it will be apparent that various changes can be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for acquiring and tracking at least one threshold voltage of at least one cell of at least one flash chip, comprising:
   acquiring the at least one threshold voltage of a particular cell of the at least one cell; and
   performing at least one threshold voltage adjustment iteration, wherein performing a particular iteration of the at least one threshold voltage adjustment iteration includes:
      updating a particular threshold voltage of the particular cell based upon detecting one or more new read-back voltages.

2. The method of claim 1, wherein acquiring the at least one threshold voltage of a particular cell of the at least one cell further comprises:
   writing a plurality of known data values to the particular cell of the at least one cell;
   detecting a plurality of read-back voltages from the particular cell;
   determining at least two distributions of read-back voltages for the plurality of read-back voltages of the particular cell, the at least two distributions including at least a first distribution of read-back voltages and a second distribution of read-back voltages, the first distribution of read-back voltages being a distribution of read-back voltages given that a first particular data value was written to the particular cell, the second distribution of read-back voltages being a distribution of read-back voltages given that a second particular data value was written to the particular cell, wherein the first and second distributions are adjacent distributions;
   determining an average voltage for each of the first and second distributions of read-back voltages; and
   determining a threshold voltage to be the mean of two average voltages of two adjacent distributions of read-back voltages.

3. The method of claim 1, wherein updating a particular threshold voltage of the particular cell based upon detecting one or more new read-back voltages further comprises:
   determining an updated average voltage of a first distribution of read-back voltages to be the mean of an old average voltage of the first distribution of read-back voltages and a first new read-back voltage of the one or more new read-back voltages, the first distribution of read-back voltages being a distribution of read-back voltages given that a first particular data value was written to the particular cell, the first new read-back voltage being associated with the first particular data value being written to the particular cell; and
   updating the particular threshold voltage of the particular cell to be the mean of the updated average voltage of the first distribution of read-back voltages and an updated or non-updated average voltage of a second distribution of read-back voltages, the second distribution of read-back voltages being adjacent to the first distribution of read-back voltages.

4. The method of claim 1, wherein updating a particular threshold voltage of the particular cell based upon detecting one or more new read-back voltages further comprises:
   determining an updated average voltage of a first distribution of read-back voltages to be a sum, the sum comprising a sum of at least the following:
      an old average voltage of the first distribution of read-back voltages; and
      a product of an error and a programmable gain scalar, wherein the error is the difference of the old average voltage of the first distribution of read-back voltages and a first new read-back voltage of the one or more new read-back voltages, the first distribution of read-back voltages being a distribution of read-back voltages given that a first particular data value was written to the particular cell, the first new read-back voltage being associated with the first particular data value being written to the particular cell; and
   updating the particular threshold voltage of the particular cell to be a mean of the updated average voltage of the first distribution of read-back voltages and an updated or non-updated average voltage of a second distribution of read-back voltages, the second distribution of read-back voltages being adjacent to the first distribution of read-back voltages.

5. The method of claim 1, wherein acquiring the at least one threshold voltage of a particular cell of the at least one cell further comprises:
   writing a known data pattern to a plurality of spare neighbor cells, the plurality of spare neighbor cells being adjacent to a particular cell of the at least one flash chip;
   detecting a plurality of read-back voltages from the plurality of spare neighbor cells; and
   determining the particular threshold voltage of the at least one threshold voltage of the particular cell based upon the plurality of read-back voltages of the plurality of spare neighbor cells.

6. The method of claim 5, wherein determining the particular threshold voltage of the at least one threshold voltage of the particular cell based upon the plurality of read-back voltages of the plurality of spare neighbor cells further comprises:
   determining the particular threshold voltage of the at least one threshold voltage of the particular cell based upon the plurality of read-back voltages of the plurality of spare neighbor cells such that the particular threshold voltage accounts for the effect of inter-cell interference.

7. The method of claim 1, further comprising:
   detecting a plurality of read-back voltages from the particular cell;
   determining at least two distributions of read-back voltages for the plurality of read-back voltages of the particular cell, the at least two distributions including at least a first distribution of read-back voltages and a second distribution of read-back voltages, the first distribution of read-back voltages being a distribution of read-back voltages given that a first particular data value was written to the particular cell, the second distribution of read-back voltages being a distribution of read-back voltages given that a second particular data value was written to the particular cell;
   determining a mean for each of the first and second distributions of read-back voltages; and
   determining a variance for each of the first and second distributions of read-back voltages.

8. The method of claim 7, further comprising:
   determining a soft information threshold;
   comparing one or more new read-back voltages against the particular threshold voltage to make a hard decision as to a particular data value written to the particular cell;
   generating soft information for the one or more new read-back voltages based upon the mean and variance for each of the first and second distributions of read-back voltages, wherein the soft information is configured to improve the accuracy of determining the particular data value written to the particular cell; and comparing the generated soft information and the soft information threshold to determine whether to perform a particular iteration of the at least one threshold voltage adjustment iteration.

9. The method of claim 8, wherein the soft information threshold comprises a log-likelihood ratio threshold and wherein the soft information comprises a log-likelihood ratio.

10. The method of claim 7, further comprising:
generating soft information for an error-correcting code decoder based upon the mean and variance for each of the first and second distributions of read-back voltages.

11. The method of claim 1, further comprising:
determining whether to perform a particular iteration of at least one threshold voltage adjustment iteration based upon a condition.

12. The method of claim 11, wherein the condition comprises at least one of a system performance condition, a user-defined condition, a predetermined condition, a system idle condition, a soft information condition, or a time-based condition.

13. The method of claim 1, wherein the at least one cell of at least one flash chip comprises at least one cell of at least one NAND flash chip.

14. The method of claim 13, wherein the at least one cell of at least one NAND flash chip comprises at least one single level cell (SLC) of at least one NAND flash chip.

15. The method of claim 13, wherein the at least one cell of at least one NAND flash chip comprises at least one multi-level cell (MLC) of at least one NAND flash chip.

16. An apparatus, comprising:
a controller configured for acquiring and tracking at least one threshold voltage of at least one cell of at least one flash chip, the controller further configured for:
acquiring the at least one threshold voltage of a particular cell of the at least one cell; and
performing at least one threshold voltage adjustment iteration, wherein performing a particular iteration of the at least one threshold voltage adjustment iteration includes:
writing a known data pattern to a plurality of spare neighbor cells, the plurality of spare neighbor cells being adjacent to the particular cell of the at least one flash chip;
detecting a plurality of read-back voltages from the plurality of spare neighbor cells; and
adjusting the particular threshold voltage of the particular cell based upon the plurality of read-back voltages of the plurality of spare neighbor cells.

17. A flash memory system, comprising:
at least one flash chip; and
a controller configured for acquiring and tracking at least one threshold voltage of at least one cell of the at least one flash chip, the controller further configured for:
acquiring the at least one threshold voltage of a particular cell of the at least one cell; and
performing at least one threshold voltage adjustment iteration, wherein performing a particular iteration of the at least one threshold voltage adjustment iteration comprises:
performing a particular iteration of the at least one threshold voltage adjustment iteration upon a determination that an error-correcting code associated with one or more new read-back voltages from the particular cell decodes to the correct data value written to the particular cell.

18. The apparatus of claim 16, wherein adjusting the particular threshold voltage of the particular cell based upon the plurality of read-back voltages of the plurality of spare neighbor cells further comprises:
adjusting the particular threshold voltage of the particular cell to account for the effect of inter-cell interference based upon the plurality of read-back voltages of the plurality of spare neighbor cells.

19. The flash memory system of claim 17, wherein performing a particular iteration of the at least one threshold voltage adjustment iteration upon a determination that an error-correcting code associated with one or more new read-back voltages from the particular cell decodes to the correct data value written to the particular cell further comprises:
performing a particular iteration of the at least one threshold voltage adjustment iteration only upon a determination that an error-correcting code associated with one or more new read-back voltages from the particular cell decodes to the correct data value written to the particular cell.

20. The flash memory system of claim 19, wherein performing a particular iteration of the at least one threshold voltage adjustment iteration only upon a determination that an error-correcting code associated with one or more new read-back voltages from the particular cell decodes to the correct data value written to the particular cell further comprises:
determining a first new read-back voltage of the one or more new read-back voltages to be associated with a first particular data value based upon a determination that the error-correcting code associated with one or more new read-back voltages from the particular cell correctly decodes to the first particular data value;
determining an updated average voltage of a first distribution of read-back voltages, the first distribution of read-back voltages being a distribution of read-back voltages given that a first particular data value was written to the particular cell; and
updating the particular threshold voltage of the particular cell based upon the updated average voltage of the first distribution of read-back voltages.

* * * * *